(12) United States Patent
Sakurai et al.

(10) Patent No.: US 10,250,231 B2
(45) Date of Patent: Apr. 2, 2019

(54) ACOUSTIC WAVE DEVICE

(71) Applicant: TAIYO YUDEN CO., LTD., Tokyo (JP)

(72) Inventors: Minako Sakurai, Tokyo (JP); Osamu Kawachi, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 0 days.

(21) Appl. No.: 15/603,774

(22) Filed: May 24, 2017

(65) Prior Publication Data

US 2017/0353173 A1 Dec. 7, 2017

(30) Foreign Application Priority Data

Jun. 7, 2016 (JP) ................. 2016-113447

(51) Int. Cl.
H03H 9/72 (2006.01)
H01L 41/047 (2006.01)
(Continued)

(52) U.S. Cl.
CPC ........... *H03H 9/725* (2013.01); *H01L 41/047* (2013.01); *H01L 41/053* (2013.01);
(Continued)

(58) Field of Classification Search
CPC .. H03H 9/64; H03H 7/12; H03H 9/17; H03H 9/54; H03H 9/542; H03H 9/568;
(Continued)

(56) References Cited

U.S. PATENT DOCUMENTS

2013/0127565 A1 5/2013 Nishihara et al.

FOREIGN PATENT DOCUMENTS

JP 11-136081 A 5/1999
JP 2002-9584 A 1/2002
(Continued)

OTHER PUBLICATIONS

Pastureaud et al. ,"High-Frequency Surface Acoustic Waves Excited on Thin-Oriented LiNbO3 Single-Crystal Layers Transferred Onto Silicon", IEEE transactions on ultrasonics, ferroelectrics, and frequency control, vol. 54, No. 4, Apr. 2007, pp. 870-876.*
(Continued)

*Primary Examiner* — Benny T Lee
*Assistant Examiner* — Hafizur Rahman
(74) *Attorney, Agent, or Firm* — Chen Yoshimura LLP

(57) ABSTRACT

An acoustic wave device includes: a support substrate; a first piezoelectric substrate bonded to a first principal surface of the support substrate, the first piezoelectric substrate being a single crystal substrate, a first acoustic wave resonator located on an opposite surface of the first piezoelectric substrate from a surface to which the support substrate is bonded, the first acoustic wave resonator including an IDT; a second piezoelectric substrate bonded to a second principal surface of the support substrate opposite from the first principal surface, the second piezoelectric substrate being a single crystal substrate; and a second acoustic wave resonator located on an opposite surface of the second piezoelectric substrate from a surface to which the support substrate is bonded, the second acoustic wave resonator including an IDT.

11 Claims, 17 Drawing Sheets

(51) Int. Cl.
| | |
|---|---|
| *H01L 41/053* | (2006.01) |
| *H01L 41/187* | (2006.01) |
| *H03H 9/02* | (2006.01) |
| *H03H 9/25* | (2006.01) |
| *H03H 9/64* | (2006.01) |
| *H03H 9/70* | (2006.01) |
| *H03H 9/05* | (2006.01) |

(52) U.S. Cl.
 CPC ..... *H01L 41/1873* (2013.01); *H03H 9/02007* (2013.01); *H03H 9/02535* (2013.01); *H03H 9/059* (2013.01); *H03H 9/0552* (2013.01); *H03H 9/0576* (2013.01); *H03H 9/25* (2013.01); *H03H 9/6483* (2013.01); *H03H 9/706* (2013.01)

(58) Field of Classification Search
 CPC ............... H03H 9/6403; H03H 9/6483; H03H 2210/025; H03H 9/725
 USPC ......................................................... 333/174
 See application file for complete search history.

(56) References Cited

FOREIGN PATENT DOCUMENTS

| | | |
|---|---|---|
| JP | 2007-60465 A | 3/2007 |
| JP | 2010-98551 A | 4/2010 |
| JP | 2010-200197 A | 9/2010 |
| JP | 2013-110655 A | 6/2013 |
| WO | 2010/103713 A1 | 9/2010 |

OTHER PUBLICATIONS

Artieda et al., "Growth study of AlN on amorphous films with defined roughness", 2008 IEEE International Ultrasonics Symposium Proceedings, pp. 907-911.*

Japanese Office Action dated Dec. 4, 2018, in a counterpart Japanese patent application No. 2016-113447. (A machine translation (not reviewed for accuracy) attached.).

* cited by examiner

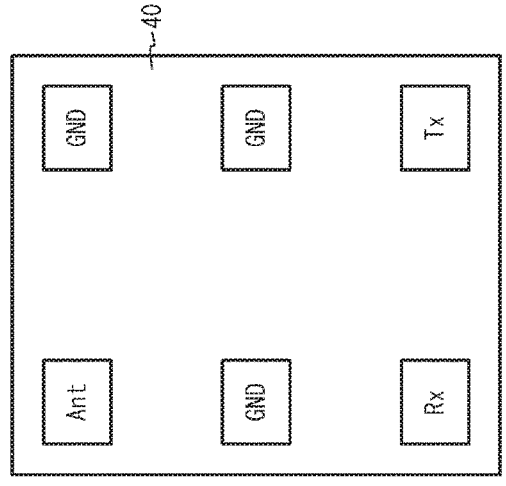
FIG. 9C
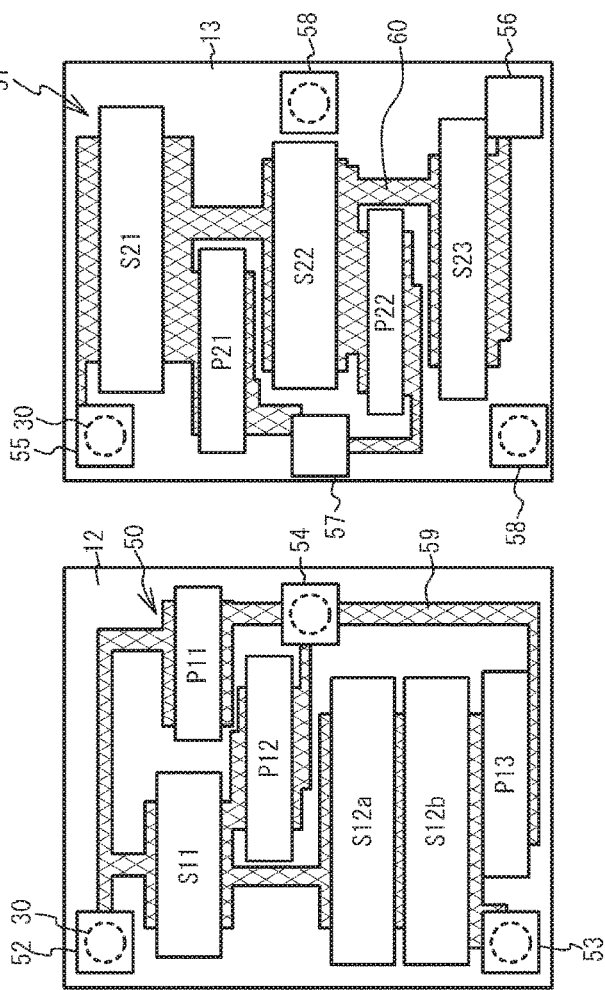
FIG. 9B
FIG. 9A

ACOUSTIC WAVE DEVICE

CROSS-REFERENCE TO RELATED APPLICATION

This application is based upon and claims the benefit of priority of the prior Japanese Patent Application No. 2016-113447, filed on Jun. 7, 2016, the entire contents of which are incorporated herein by reference.

FIELD

A certain aspect of the present invention relates to an acoustic wave device.

BACKGROUND

There has been known an acoustic wave device in which a first piezoelectric substrate having a comb-shaped electrode is bonded to a first surface of a support substrate and a second piezoelectric substrate having no comb-shaped electrode and of which the material and the crystal axis orientation are the same as those of the first piezoelectric substrate is bonded to a second surface of the support substrate to reduce the warpage of the substrate due to the temperature change as disclosed in, for example, Japanese Patent Application Publication No. 2010-200197. In addition, there has been also known an acoustic wave device in which the directions of the electrode fingers of acoustic wave resonators located on both surfaces of a piezoelectric substrate are made not to be parallel to each other to reduce the deviation of the center frequency as disclosed in, for example, Japanese Patent Application Publication No. 11-136081. There has been also known an acoustic wave device in which an acoustic wave resonator is formed on each of piezoelectric thin films located on both surfaces of a substrate as disclosed in, for example, Japanese Patent Application Publication No. 2007-60465.

When acoustic wave resonators each including an Interdigital Transducer (IDT) are located on the principal surface of a piezoelectric substrate, a bulk wave generated from one of the acoustic wave resonators may be reflected by the lower surface of the piezoelectric substrate and enter another acoustic wave resonator, deteriorating the characteristics. Additionally, when acoustic wave resonators are located on both principal surfaces of the piezoelectric substrate, a bulk wave generated from the acoustic wave resonator located on a first principal surface of the piezoelectric substrate may pass through the piezoelectric substrate and enter the acoustic wave resonator located on a second principal surface, deteriorating the characteristics.

SUMMARY OF THE INVENTION

According to a first aspect of the present invention, there is provided an acoustic wave device including: a support substrate; a first piezoelectric substrate bonded to a first principal surface of the support substrate, the first piezoelectric substrate being a single crystal substrate, a first acoustic wave resonator located on an opposite surface of the first piezoelectric substrate from a surface to which the support substrate is bonded, the first acoustic wave resonator including an IDT; a second piezoelectric substrate bonded to a second principal surface of the support substrate opposite from the first principal surface, the second piezoelectric substrate being a single crystal substrate; and a second acoustic wave resonator located on an opposite surface of the second piezoelectric substrate from a surface to which the support substrate is bonded, the second acoustic wave resonator including an IDT.

According to a first aspect of the present invention, there is provided an acoustic wave device including: a first piezoelectric substrate; a first acoustic wave resonator located on a first principal surface of the first piezoelectric substrate, the first acoustic wave resonator including an IDT; a second piezoelectric substrate of which a first principal surface is bonded to a second principal surface of the first piezoelectric substrate opposite from the first principal surface of the first piezoelectric substrate; a second acoustic wave resonator located on a second principal surface of the second piezoelectric substrate opposite from the first principal surface of the second piezoelectric substrate, the second acoustic wave resonator including an IDT; and a layer bonding the second principal surface of the first piezoelectric substrate and the first principal surface of the second piezoelectric substrate, the layer being an amorphous layer or an adhesive agent layer.

BRIEF DESCRIPTION OF THE DRAWINGS

FIG. 9A through FIG. 9C are plan views of the acoustic wave device in accordance with the fourth embodiment;

DETAILED DESCRIPTION

Hereinafter, a description will be given of embodiments of the present invention with reference to the accompanying drawings.

First Embodiment

Figure 1A:
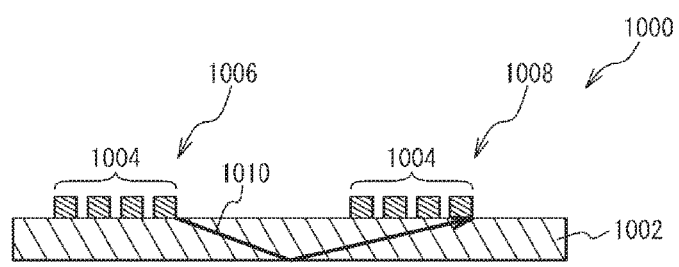
FIG. 1A is a cross-sectional view of an acoustic wave device in accordance with a first comparative example.
Figure 1B:
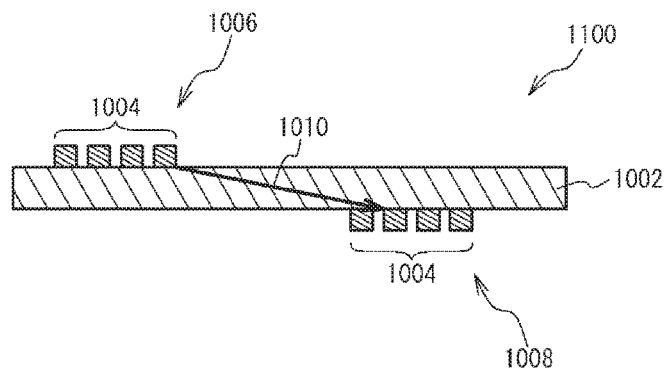
FIG. 1B is a cross-sectional view of an acoustic wave device in accordance with a second comparative example.

First, an acoustic wave device in accordance with a comparative example will be described. FIG. 1A is a cross-sectional view of an acoustic wave device in accordance with a first comparative example, and FIG. 1B is a cross-sectional view of an acoustic wave device in accordance with a second comparative example. As illustrated in FIG. 1A, an acoustic wave device 1000 of the first comparative example includes two acoustic wave resonators 1006 and 1008 each including an Interdigital Transducer (IDT) 1004 on the principal surface of a piezoelectric substrate 1002. In the first comparative example, depending on the thickness of the piezoelectric substrate 1002, a bulk wave 1010 generated from one acoustic wave resonator 1006 may be reflected by the lower surface of the piezoelectric substrate 1002, and enter the other acoustic wave resonator 1008. In this case, the surface acoustic wave excited by the IDT 1004 of the acoustic wave resonator 1008 and the bulk wave 1010 generated from the acoustic wave resonator 1006 interfere with each other, deteriorating the characteristics of the acoustic wave resonator 1008.

As illustrated in FIG. 1B, an acoustic wave device 1100 of the second comparative example includes the acoustic wave resonators 1006 and 1008 each including the IDT 1004 on both principal surfaces of the piezoelectric substrate 1002. In the second comparative example, the bulk wave 1010 generated from the acoustic wave resonator 1006 located on one principal surface of the piezoelectric substrate 1002 may enter the acoustic wave resonator 1008 located on the other principal surface of the piezoelectric substrate 1002. In this case, the characteristics of the acoustic wave resonator 1008 deteriorate.

Hereinafter, embodiments that reduce the deterioration of the characteristics will be described.

Figure 2:
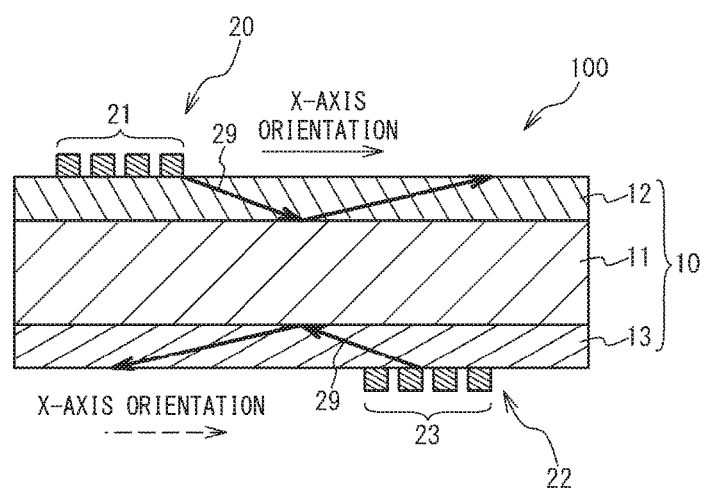
FIG. 2 is a cross-sectional view of an acoustic wave device in accordance with a first embodiment.

FIG. 2 is a cross-sectional view of an acoustic wave device in accordance with a first embodiment. As illustrated in FIG. 2, an acoustic wave device 100 of the first embodiment includes a bonding substrate 10 including: a support substrate 11; a piezoelectric substrate 12 that is a single crystal substrate bonded to a first principal surface of the support substrate 11; and a piezoelectric substrate 13 that is a single crystal substrate bonded to a second principal surface of the support substrate 11 opposite from the first principal surface. The support substrate 11 has a thickness of, for example, approximately 180 μm. The piezoelectric substrates 12 and 13 have approximately identical thicknesses of, for example, about 40 μm. The support substrate 11 is, for example, a sapphire substrate. The piezoelectric substrates 12 and 13 are, for example, rotated Y-cut X-propagation lithium tantalate (LT) substrates.

An acoustic wave resonator 20 including an IDT 21 is located on an opposite surface of the piezoelectric substrate 12 from the surface bonded to the support substrate 11. An acoustic wave resonator 22 including an IDT 23 is located on an opposite surface of the piezoelectric substrate 13 from the surface bonded to the support substrate 11. The IDTs 21 and 23 are formed of, for example, a metal film in which titanium (Ti) and aluminum (Al) alloy are stacked in this order from the piezoelectric substrate side.

Figure 3:
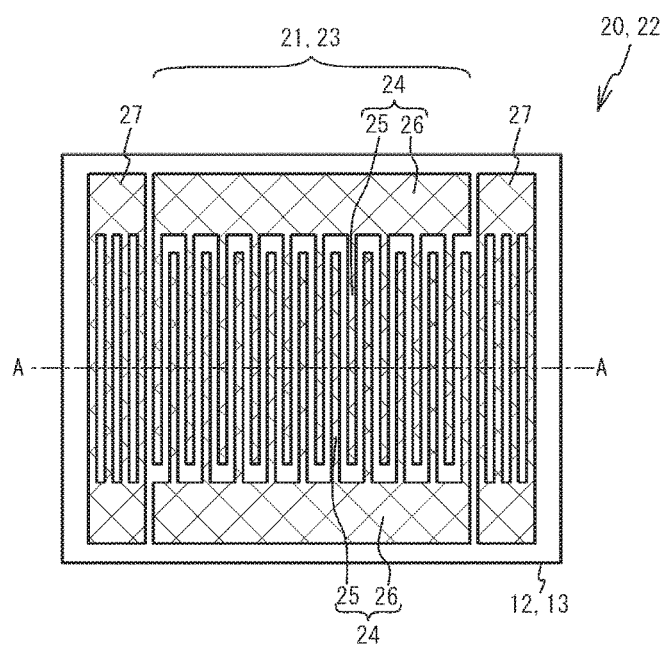
FIG. 3 is a plan view of an acoustic wave resonator.

FIG. 3 is a plan view of the acoustic wave resonator. As illustrated in FIG. 3, the acoustic wave resonators 20 and 22 respectively include the IDTs 21 and 23 each including a pair of comb-shaped electrodes 24 and reflectors 27 located at both sides of the IDTs 21 and 23. The comb-shaped electrode 24 includes electrode fingers 25, and a bus bar 26 to which the electrode fingers 25 are connected. A pair of the comb-shaped electrodes 24 face each other so that the electrode fingers 25 of one of the comb-shaped electrodes 24 are substantially alternated with the electrode fingers 25 of the other one of the comb-shaped electrodes 24.

The acoustic wave excited by the electrode fingers 25 mainly propagates in the alignment direction of the electrode fingers 25. The pitch of the electrode fingers 25 corresponds to approximately the wavelength of the acoustic wave. When the piezoelectric substrates 12 and 13 are rotated Y-cut X-propagation LT substrates, the acoustic waves propagate in the X-axis orientations of the crystal orientations of the piezoelectric substrates 12 and 13.

Figure 4A:
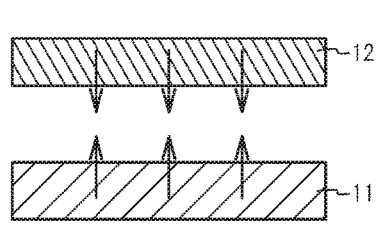
FIG. 4A through FIG. 4F are cross-sectional views illustrating a method of fabricating the acoustic wave device in accordance with the first embodiment.

FIG. 4A through FIG. 4F are cross-sectional views illustrating a method of fabricating the acoustic wave device in accordance with the first embodiment. As illustrated in FIG. 4A, the piezoelectric substrate 12 is bonded to the first principal surface of the support substrate 11. The piezoelectric substrate 12 may be bonded by direct bonding or by using an adhesive agent. In the case of direct bonding, surface activated bonding at normal temperature may be employed, for example. In the case of direct bonding, the support substrate 11 and the piezoelectric substrate 12 are firmly bonded to each other when atoms constituting the support substrate 11 and atoms constituting the piezoelectric substrate 12 form an amorphous layer (not illustrated) at the boundary between the support substrate 11 and the piezoelectric substrate 12.

Figure 4D:
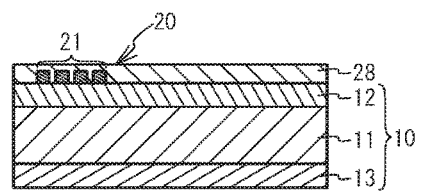
Figure 4B:
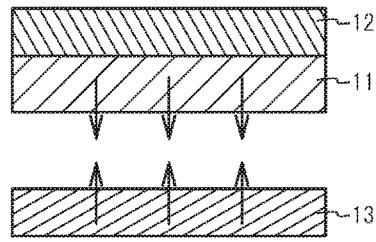

As illustrated in FIG. 4B, the piezoelectric substrate 13 is bonded to the second principal surface of the support substrate 11. The piezoelectric substrate 13 may be bonded by direct bonding or by using an adhesive agent as with the piezoelectric substrate 12. In the case of direct bonding, surface activated bonding at normal temperature may be employed, for example. In the case of direct bonding, the support substrate 11 and the piezoelectric substrate 13 are firmly bonded to each other when atoms constituting the support substrate 11 and atoms constituting the piezoelectric substrate 13 form an amorphous layer (not illustrated) at the boundary between the support substrate 11 and the piezoelectric substrate 13.

Figure 4E:
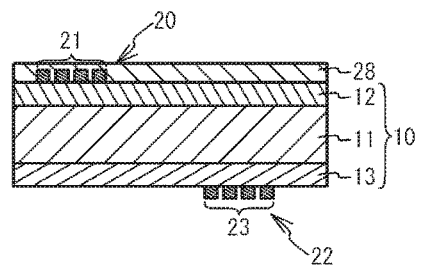
Figure 4C:
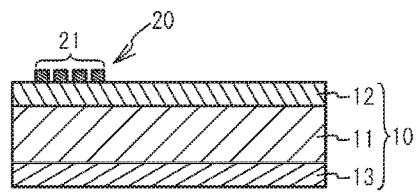

As illustrated in FIG. 4C, after the piezoelectric substrates 12 and 13 are bonded to the support substrate 11, the piezoelectric substrates 12 and 13 are polished by, for example, Chemical Mechanical Polishing (CMP) to thin the piezoelectric substrates 12 and 13. The above processes form the bonding substrate 10 formed of the support substrate 11 and the piezoelectric substrates 12 and 13. Then, the acoustic wave resonator 20 including the IDT 21 is formed on the opposite surface of the piezoelectric substrate 12 from the surface bonded to the support substrate 11. The IDT 21 can be formed by a typical method.

As illustrated in FIG. 4D, formed is a protective film 28 covering the acoustic wave resonator 20 formed on the piezoelectric substrate 12. The protective film 28 is, for example, a resist film.

As illustrated in FIG. 4E, after the formation of the protective film 28, the acoustic wave resonator 22 including the IDT 23 is formed on the opposite surface of the piezoelectric substrate 13 from the surface bonded to the support substrate 11. The IDT 23 cab be formed by a typical method.

Figure 4F:
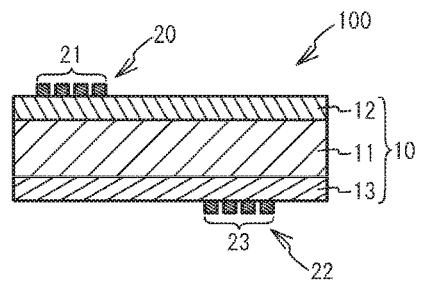

As illustrated in FIG. 4F, the protective film 28 is removed. This process completes the acoustic wave device 100 of the first embodiment.

In the first embodiment, as illustrated in FIG. 2, the piezoelectric substrate 12, which is a single crystal substrate, is bonded to the first principal surface of the support substrate 11, and the piezoelectric substrate 13, which is a single crystal substrate, is bonded to the second principal surface of the support substrate 11. The acoustic wave resonator 20 including the IDT 21 is located on the opposite surface of the piezoelectric substrate 12 from the surface bonded to the support substrate 11, and the acoustic wave resonator 22 including the IDT 23 is located on the opposite surface of the piezoelectric substrate 13 from the surface bonded to the support substrate 11. This structure causes a bulk wave 29 generated from the IDT 21 to be reflected by the support substrate 11 and to be inhibited from entering the IDT 23. The bulk wave 29 generated from the IDT 23 is also inhibited from entering the IDT 21 in the same manner. Accordingly, the interference between the surface acoustic waves excited by the IDTs 21 and 23 and the bulk wave 29 is reduced. Therefore, the occurrence of spurious in the characteristics of the acoustic wave resonators 20 and 22 is reduced, and the deterioration of the characteristics of the acoustic wave resonators 20 and 22 is therefore reduced.

Additionally, in the first embodiment, the support substrate 11 is a sapphire substrate, and the piezoelectric substrates 12 and 13 are LT substrates. As configured above, the acoustic impedance of the support substrate 11 is preferably greater than the acoustic impedance of the piezoelectric substrates 12 and 13 so that the bulk waves 29 generated from the IDTs 21 and 23 are easily reflected by the support substrate 11.

Additionally, in the first embodiment, the piezoelectric substrates 12 and 13 are rotated Y-cut X-propagation LT substrates, and as illustrated in FIG. 2, the X-axis orientation (solid line arrow) of the crystal orientation of the piezoelectric substrate 12 is oriented in the same direction as the X-axis orientation (dashed line arrow) of the crystal orientation of the piezoelectric substrate 13. The LT substrate has different thermal expansion coefficients depending on the crystal axis orientation, and its thermal expansion coefficients in the X-axis and Y-axis orientations are 16.1 ppm/° C. and the thermal expansion coefficient in the Z-axis orientation is 4.1 ppm/° C. Thus, the orientations with greater thermal expansion coefficients of the piezoelectric substrates 12 and 13 are oriented in the same direction. Since the thermal expansion coefficients of the piezoelectric substrates 12 and 13 are equal to each other, the stress caused by the difference in thermal expansion coefficient between the piezoelectric substrate 12 and the support substrate 11 is cancelled out by the stress caused by the difference in thermal expansion coefficient between the piezoelectric substrate 13 and the support substrate 11. Therefore, the warpage caused by temperature change of the bonding substrate 10 is reduced. The lithium niobate (LN) substrate also has different thermal expansion coefficients depending on the crystal axis orientation, and has thermal expansion coefficients of 15.4 ppm/° C. in the X-axis and Y-axis orientations and a thermal expansion coefficient of 7.5 ppm/° C. in the Z-axis orientation. Thus, even when the piezoelectric substrates 12 and 13 are rotated Y-cut X-propagation LN substrates, the warpage is reduced by orienting the X-axis orientations of their crystal orientations in the same direction. Additionally, even when one of the piezoelectric substrates 12 and 13 is a rotated Y-cut X-propagation LT substrate while the other is a rotated Y-cut X-propagation LN substrate, the warpage is reduced by orienting the X-axis orientations of their crystal orientations in the same direction.

In the first embodiment, the piezoelectric substrates 12 and 13 may be 34 to 48° rotated Y-cut X-propagation LT substrates, or 120 to 130° rotated Y-cut X-propagation LN substrates. The piezoelectric substrates 12 and 13 may be made of the same material or different materials. When the piezoelectric substrates 12 and 13 are made of the same material, the cut angles may be the same or different. The support substrate 11 may be a silicon substrate, a spinel substrate, an aluminum oxide substrate, or a glass substrate instead of a sapphire substrate. The IDTs 21 and 23 may be formed of a single-layer film of titanium (Ti), gold (Au), chrome (Cr), copper (Cu), molybdenum (Mo), tungsten (W), aluminum (Al), or an alloy thereof, or a multilayered film of at least two of them.

Second Embodiment

Figure 5:
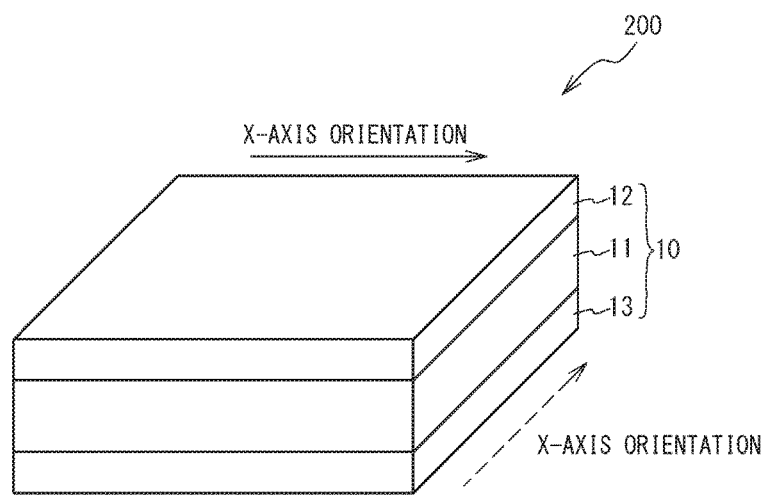
FIG. 5 is a perspective view of an acoustic wave device in accordance with a second embodiment.

FIG. 5 is a perspective view of an acoustic wave device in accordance with a second embodiment. Although the acoustic wave resonators 20 and 22 are also provided in the second embodiment as in the first embodiment, the illustration thereof is omitted in FIG. 5. As illustrated in FIG. 5, in an acoustic wave device 200 of the second embodiment, the X-axis orientation (solid line arrow) of the crystal orientation of the piezoelectric substrate 12, which is of a rotated Y-cut X-propagation LT substrate, is substantially perpendicular to the X-axis orientation (dashed line arrow) of the crystal orientation of the piezoelectric substrate 13, which is a rotated Y-cut X-propagation LT substrate.

In the second embodiment, the piezoelectric substrates 12 and 13 are rotated Y-cut X-propagation LT substrates, and the X-axis orientation of the crystal orientation of the piezoelectric substrate 12 and the X-axis orientation of the crystal orientation of the piezoelectric substrate 13 are oriented in different directions. As described above, when the piezoelectric substrates 12 and 13 are rotated Y-cut X-propagation LT substrates, the acoustic wave propagates in the X-axis orientation of the crystal orientation. Thus, in the second embodiment, the propagation direction of the acoustic wave generated from the acoustic wave resonator 20 located on the piezoelectric substrate 12 is substantially perpendicular to the propagation direction of the acoustic wave generated from the acoustic wave resonator 22 located on the piezoelectric substrate 13. Therefore, for example, even when a part of the bulk wave generated from one of the acoustic wave resonators 20 and 22 enters the other acoustic wave resonator through the bonding substrate 10, since the propagation direction of the surface acoustic wave excited by the other acoustic wave resonator is substantially perpendicular to the propagation direction of the bulk wave entering through the bonding substrate 10, the interference between waves is reduced. Accordingly, the deterioration of the characteristics of the acoustic wave resonator is reduced.

The second embodiment has described an exemplary case where the piezoelectric substrates 12 and 13 are rotated Y-cut X-propagation LT substrates, but the same effect is also achieved when the piezoelectric substrates 12 and 13 are rotated Y-cut X-propagation LN substrates or when one of the piezoelectric substrates 12 and 13 is a rotated Y-cut X-propagation LT substrate and the other is a rotated Y-cut X-propagation LN substrate.

Third Embodiment

Figure 6A:
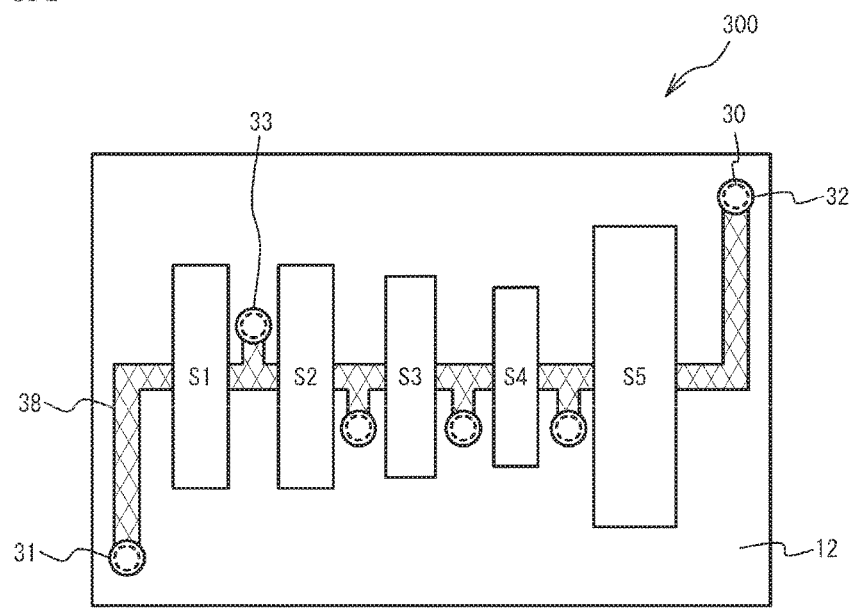
FIG. 6A and FIG. 6B are plan views of an acoustic wave device in accordance with a third embodiment.
Figure 6B:
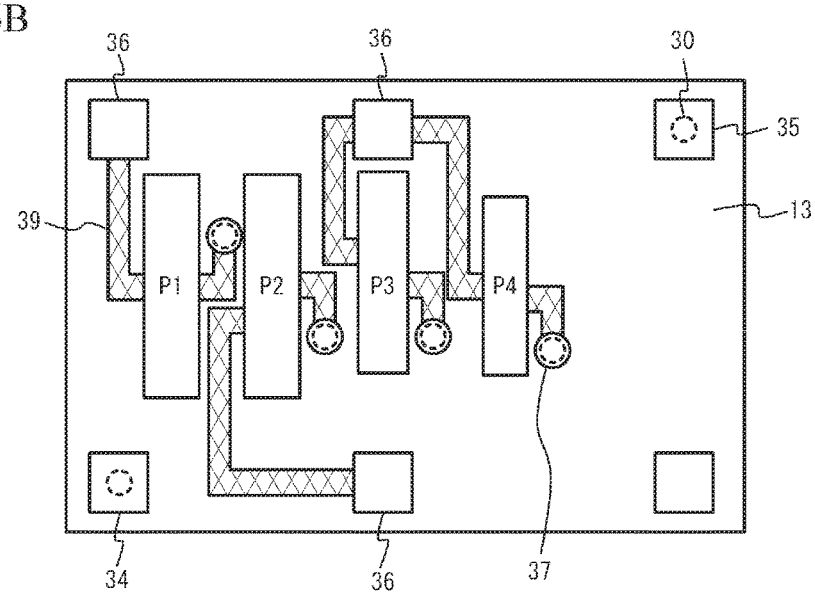
Figure 7:
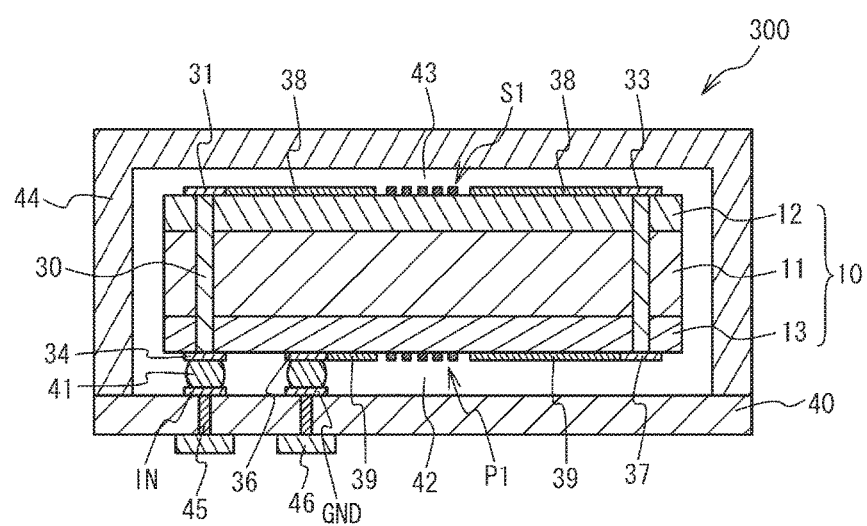
FIG. 7 is a cross-sectional view of the acoustic wave device in accordance with the third embodiment.

FIG. 6A and FIG. 6B are plan views of an acoustic wave device in accordance with a third embodiment. FIG. 7 is a cross-sectional view of the acoustic wave device in accordance with the third embodiment. FIG. 6A is a plan view of the opposite surface of the piezoelectric substrate 12 from the surface bonded to the support substrate 11, and FIG. 6B is a plan view of the opposite surface of the piezoelectric substrate 13 from the surface bonded to the support substrate 11. FIG. 6A and FIG. 6B simplistically illustrate resonators.

In an acoustic wave device 300 of the third embodiment, as illustrated in FIG. 6A, located on the piezoelectric substrate 12 are one or more series resonators S1 through S5 that are the acoustic wave resonators 20. The series resonators S1 through S5 are connected in series between a pad 31 and a pad 32 through wiring lines 38. Pads 33 are coupled to the wiring lines 38 between the series resonators S1 through S5.

As illustrated in FIG. 6B, located on the piezoelectric substrate 13 are one or more parallel resonators P1 through P4 that are the acoustic wave resonators 22. One of the comb-shaped electrodes 24 of each of the parallel resonators P1 through P4 is coupled to a pad 37 through a wiring line 39, and the other of the comb-shaped electrodes 24 is coupled to a pad 36 through the wiring line 39. Located on the piezoelectric substrate 13 are pads 34 and 35.

As illustrated in FIG. 6A through FIG. 7, via wirings 30 penetrating through the bonding substrate 10 are formed. The pad 31 located on the piezoelectric substrate 12 is electrically coupled through the via wiring 30 to the pad 34 located on the piezoelectric substrate 13. The pad 32 located on the piezoelectric substrate 12 is electrically coupled through the via wiring 30 to the pad 35 located on the piezoelectric substrate 13. The pad 33 located on the piezoelectric substrate 12 is electrically coupled through the via wiring 30 to the pad 37 located on the piezoelectric substrate 13.

The bonding substrate 10 is flip-chip mounted on a package substrate 40 by bumps 41 so that the surface of the piezoelectric substrate 13 on which the parallel resonators P1 through P4 are located faces the package substrate 40 with a planar shape. That is, the pad 34 is coupled to an input pad IN on the upper surface of the package substrate 40, the pad 35 is coupled to an output pad OUT (not illustrated) on the upper surface of the package substrate 40, and the pad 36 is coupled to a ground pad GND on the upper surface of the package substrate 40. Thus, the acoustic wave device 300 of the third embodiment is a ladder-type filter including the series resonators S1 through S5 connected in series and the parallel resonators P1 through P4 connected in parallel between the input pad IN and the output pad OUT (not illustrated). The parallel resonators P1 through P4 are exposed to an air gap 42 between the piezoelectric substrate 13 and the package substrate 40.

On the package substrate 40, a recess-shaped lid 44 covering and sealing the bonding substrate 10 is located. The series resonators S1 through S5 are exposed to an air gap 43 between the piezoelectric substrate 12 and the lid 44. The lid 44 is preferably formed of metal in consideration of hermetic sealing, but may be formed of other materials such as resin.

Foot pads 46 used to provide an electrical connection with an external device are located on the lower surface of the package substrate 40. The input pad IN, the output pad OUT (not illustrated), and the ground pads GND located on the upper surface of the package substrate 40 are electrically coupled through via wirings 45 penetrating through the package substrate 40 to the foot pads 46 located on the lower surface of the package substrate 40.

In the third embodiment, one or more series resonators S1 through S5 constituting a ladder-type filter are located on the piezoelectric substrate 12, and one or more parallel resonators P1 through P4 constituting the ladder-type filter are located on the piezoelectric substrate 13. For example, when both series resonators and parallel resonators are located on the piezoelectric substrate 12, the parallel resonators are to be arranged in the direction in which the acoustic wave of the series resonator propagates, and the series resonators are to be arranged in the direction in which the acoustic wave of the parallel resonator propagates. Thus, the bulk wave generated from the series resonator is reflected by the support substrate 11 and enters the parallel resonator, while the bulk wave generated from the parallel resonator is reflected by the support substrate 11 and easily enters the series resonator. In contrast, in the third embodiment, the series resonators S1 through S5 are located on the piezoelectric substrate 12, and the parallel resonators P1 through P4 are located on the piezoelectric substrate 13. Thus the bulk wave generated from the series resonator is inhibited from entering the parallel resonator, and the bulk wave generated from the parallel resonator is inhibited from the series resonator. Therefore, the ladder-type filter in which the deterioration of the characteristics is reduced is obtained.

In addition, the parallel resonators mainly affect the skirt characteristics at the low frequency side of the transmission characteristics of the ladder-type filter, and the series resonators mainly affect the skirt characteristics at the high frequency side. For example, there may be a case where the skirt characteristics at the low frequency side are required to be steep, but the skirt characteristics at the high frequency side are not required to be steep so much. Instead, the skirt characteristics at the high frequency side may be required to be configured so as to widen the passband of the filter. The skirt characteristics are steepened by reducing the electromechanical coupling coefficient, and the bandwidth is widen by increasing the electromechanical coupling coefficient. In the third embodiment, only the series resonators S1 through S5 are located on the piezoelectric substrate 12, and none of the parallel resonators P1 through P4 is located on the piezoelectric substrate 12. Thus, for example, a piezoelectric substrate made of a material and having a cut angle that can make the electromechanical coupling coefficients of the series resonators S1 through S5 large can be used for the piezoelectric substrate 12. In addition, only the parallel resonators P1 through P4 are located on the piezoelectric substrate 13, and none of the series resonators S1 through S5 is located on the piezoelectric substrate 13. Thus, for example, a piezoelectric substrate made of a material and having a cut angle that can make the electromechanical coupling coefficients of the parallel resonators P1 through P4 small can be used for the piezoelectric substrate 13. Therefore, the third embodiment can steepen the skirt characteristics at the low frequency side or at the high frequency side, and widen the passband.

In consideration of the tradeoff relation between the steepening of the skirt characteristics and the widening of the passband width, the piezoelectric substrates 12 and 13 are preferably made of the same material and having different cut angles, or made of different materials. For example, the piezoelectric substrates 12 and 13 are preferably rotated Y-cut X-propagation LT substrates or rotated Y-cut X-propagation LN substrates with different cut angles, or one of the piezoelectric substrates 12 and 13 is preferably a rotated Y-cut X-propagation LT substrate, and the other is preferably a rotated Y-cut X-propagation LN substrate.

In addition, in the third embodiment, the distance between the series resonators S1 through S5 and the parallel resonators P1 through P4 is approximately equal to the thickness of the bonding substrate 10. Therefore, the distance between resonators is inhibited from being long, and thereby, the transmission characteristics are improved.

Fourth Embodiment

Figure 8:
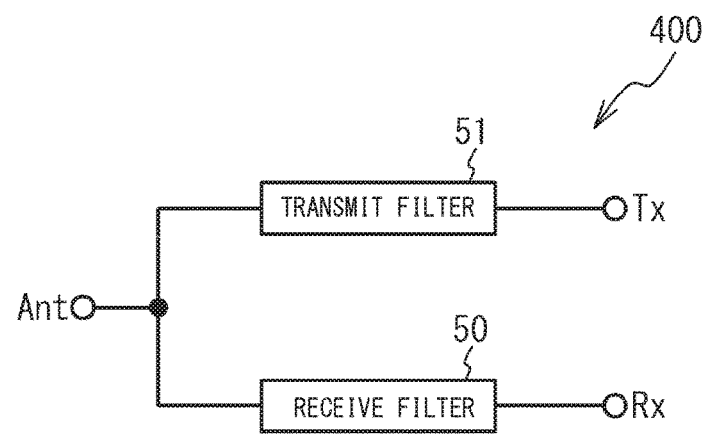
FIG. 8 illustrates an acoustic wave device in accordance with a fourth embodiment.

FIG. 8 illustrates an acoustic wave device in accordance with a fourth embodiment. As illustrated in FIG. 8, an acoustic wave device 400 of the fourth embodiment is a duplexer including a receive filter 50 connected between an antenna terminal Ant and a receive terminal Rx and a transmit filter 51 connected between the antenna terminal Ant and a transmit terminal Tx. The receive filter 50 and the transmit filter 51 have different passbands. The receive filter 50 transmits signals in the receive band to the receive terminal Rx as reception signals among signals input from the antenna terminal Ant, and suppresses signals in other bands. The transmit filter 51 transmits signals in the transmit band to the antenna terminal Ant as transmission signals among signals input from the transmit terminal Tx, and suppresses signals in other bands.

The cross-sectional view of the acoustic wave device of the fourth embodiment is the same as that of the third embodiment illustrated in FIG. 7, and the description thereof is thus omitted. FIG. 9A through FIG. 9C are plan views of the acoustic wave device in accordance with the fourth embodiment. FIG. 9A is a plan view of the opposite surface of the piezoelectric substrate 12 from the surface bonded to the support substrate 11, FIG. 9B is a plan view of the opposite surface of the piezoelectric substrate 13 from the surface bonded to the support substrate 11, and FIG. 9C is a plan view of a surface of the package substrate 40 facing the bonding substrate 10. FIG. 9A and FIG. 9B simplistically illustrate resonators.

As illustrated in FIG. 9A, located on the piezoelectric substrate 12 is the receive filter 50 including one or more series resonators S11 through S12b, which are the acoustic wave resonators 20, and one or more parallel resonators P11 through P13, which are the acoustic wave resonators 20. The receive filter 50 is a ladder-type filter. The series resonators S11 through S12b are connected in series between a pad 52 and a pad 53 through wiring lines 59. One of the comb-shaped electrodes 24 of each of the parallel resonators P11 through P13 is coupled to a pad 54 through the wiring line 59, while the other of the comb-shaped electrodes 24 is coupled to the series resonator through the wiring line 59. The series resonators S12a and S12b are divided resonators formed by dividing one series resonator, and have approximately the same resonant frequency and approximately the same capacitance. The series resonators S12a and S12b have capacitances twice the capacitance of the series resonator before divided.

As illustrated in FIG. 9B, located on the piezoelectric substrate 13 is the transmit filter 51 including one or more series resonators S21 through S23, which are the acoustic wave resonators 22, and one or more parallel resonators P21 and P22, which are the acoustic wave resonators 22. The transmit filter 51 is a ladder-type filter. The series resonators S21 through S23 are connected in series between a pad 55 and a pad 56 through wiring lines 60. One of the comb-shaped electrodes 24 of each of the parallel resonators P21 and P22 is coupled to a pad 57 through the wiring line 60, while the other of the comb-shaped electrodes 24 is coupled to the series resonator through the wiring line 60. Other pads 58 are also located on the piezoelectric substrate 13.

As illustrated in FIG. 9C, located on the package substrate 40 are an antenna pad Ant, a transmit pad Tx, a receive pad Rx, and the ground pads GND. The pad 52 located on the piezoelectric substrate 12 and the pad 55 located on the piezoelectric substrate 13 are coupled to the antenna pad Ant through the bump 41 and the via wiring 30. The pad 56 located on the piezoelectric substrate 13 is coupled to the transmit pad Tx through the bump 41. The pad 53 located on the piezoelectric substrate 12 is coupled to the receive pad Rx through the bump 41 and the via wiring 30. The pad 54 located on the piezoelectric substrate 12 and the pad 57 located on the piezoelectric substrate 13 are coupled to the ground pads GND through the bump 41 and the via wiring 30.

In the fourth embodiment, the receive filter 50 connected between the antenna terminal Ant and the receive terminal Rx is located on the piezoelectric substrate 12, and the transmit filter 51 connected between the antenna terminal Ant and the transmit terminal Tx is located on the piezoelectric substrate 13. Thus, a piezoelectric substrate made of a material and having a cut angle suitable for the receive filter 50 can be used for the piezoelectric substrate 12, while a piezoelectric substrate made of a material and having a cut angle suitable for the transmit filter 51 can be used for the piezoelectric substrate 13. The piezoelectric substrates 12 and 13 may be piezoelectric substrates made of the same material and having different cut angles. For example, the piezoelectric substrate 12 may be a 42° Y-cut X-propagation LT substrate and the piezoelectric substrate 13 may be a 46° Y-cut X-propagation LT substrate. Alternatively, the piezoelectric substrates 12 and 13 may be piezoelectric substrates made of different materials. For example, one of the piezoelectric substrates 12 and 13 may be a rotated Y-cut X-propagation LT substrate, and the other may be a rotated Y-cut X-propagation LN substrate. Accordingly, the fourth embodiment can improve the characteristics of the receive filter 50 and the transmit filter 51.

In addition, in the fourth embodiment, since the receive filter 50 and the transmit filter 51 are located on both the principal surfaces of the bonding substrate 10, the device size can be reduced compared to a case where the receive filter 50 and the transmit filter 51 are located on different chips.

Figure 10A:
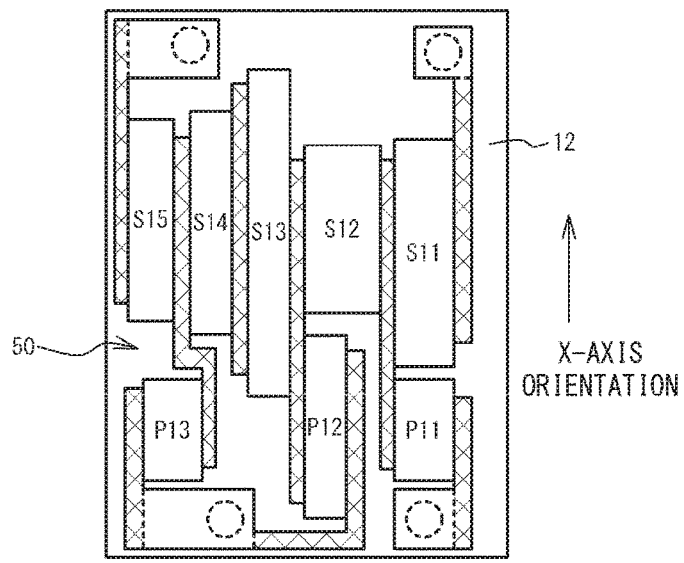
FIG. 10A and FIG. 10B are plan views of an acoustic wave device in accordance with a first variation of the fourth embodiment.
Figure 10B:
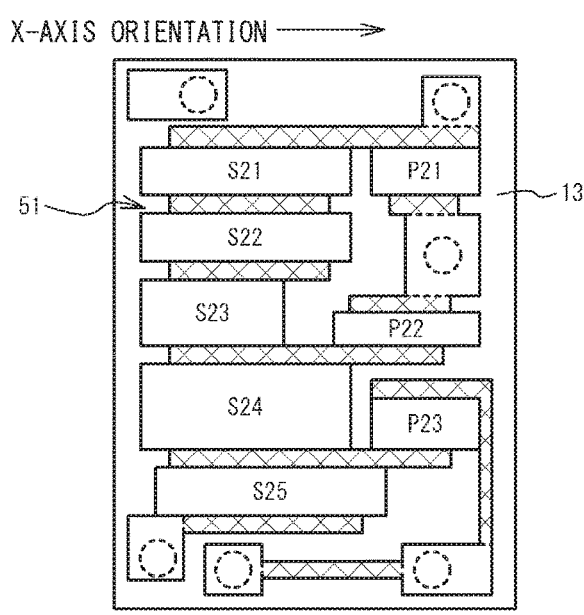

The X-axis orientation of the crystal orientation of the piezoelectric substrate 12 and the X-axis orientation of the crystal orientation of the piezoelectric substrate 13 are oriented in the same direction in the fourth embodiment, but may be oriented in different directions. FIG. 10A and FIG. 10B are plan views of an acoustic wave device in accordance with a first variation of the fourth embodiment. FIG. 10A is a plan view of the opposite surface of the piezoelectric substrate 12 from the surface bonded to the support substrate 11, and FIG. 10B is a plan view of the opposite surface of the piezoelectric substrate 13 from the surface bonded to the support substrate 11. FIG. 10A and FIG. 10B simplistically illustrate resonators.

As illustrated in FIG. 10A, the piezoelectric substrate 12 has a rectangular shape of which the longitudinal direction corresponds to the X-axis orientation of the crystal orientation. Located on the piezoelectric substrate 12 are series resonators S11 through S15 and parallel resonators P11 through P13 constituting the receive filter 50.

As illustrated in FIG. 10B, the piezoelectric substrate 13 has a rectangular shape of which the short direction corresponds to the X-axis orientation of the crystal orientation. Located on the piezoelectric substrate 13 are series resonators S21 through S25 and parallel resonators P21 through P23 constituting the transmit filter 51.

Figure 11A:
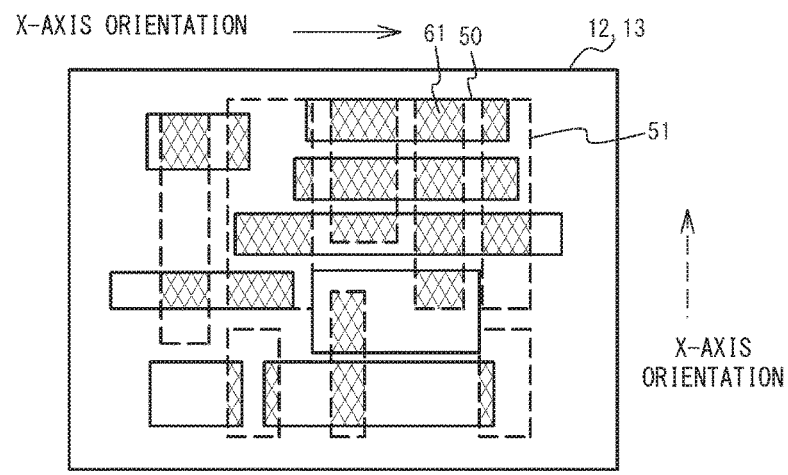
FIG. 11A and FIG. 11B are plan views superimposingly illustrating resonators constituting a receive filter and resonators constituting a transmit filter.
Figure 11B:
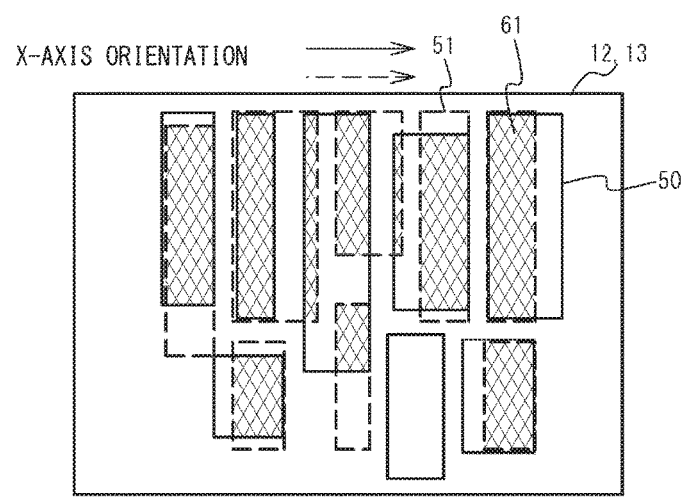

FIG. 11A and FIG. 11B are plan views superimposingly illustrating the resonators constituting the receive filter and the resonators constituting the transmit filter. FIG. 11A is a plan view illustrating a case where the X-axis orientations of the crystal orientations of the piezoelectric substrates 12 and 13 are substantially perpendicular to each other as in FIG. 10A and FIG. 10B. FIG. 11B is a plan view illustrating a case where the X-axis orientations of the crystal orientations of the piezoelectric substrates 12 and 13 are substantially oriented in the same direction. In FIG. 11A and FIG. 11B, the resonators constituting the receive filter 50 located on the piezoelectric substrate 12 are indicated by solid lines, and the resonators constituting the transmit filter 51 located on the piezoelectric substrate 13 are indicated by dashed lines. Regions 61 in which the resonator of the receive filter 50 and the resonator of the transmit filter 51 overlap are indicated by cross-hatching. The X-axis orientation of the crystal orientation of the piezoelectric substrate 12 is indicated by a solid line arrow, and the X-axis orientation of the crystal orientation of the piezoelectric substrate 13 is indicated by a dashed line arrow.

As illustrated in FIG. 11A, when the X-axis orientations of the crystal orientations of the piezoelectric substrates 12 and 13 are oriented in different directions (for example, substantially perpendicular to each other), the area of the regions 61 where the resonator of the receive filter 50 and the resonator of the transmit filter 51 overlap is reduced compared to a case where the X-axis orientations are oriented substantially in the same direction as illustrated in FIG. 11B. Accordingly, the parasitic capacitance between the resonator of the receive filter 50 and the resonator of the transmit filter 51 is reduced, and the isolation characteristics are thereby improved.

The fourth embodiment has described a case where the filters located on the piezoelectric substrates 12 and 13 are ladder-type filters, but does not intend to suggest any limitation. The filters may be, for example, double-mode type filters. In addition to a duplexer in which a receive filter is located on one of the piezoelectric substrates 12 and 13 and a transmit filter is located on the other, the acoustic wave device may be a dual filter in which receive filters or transmit filters are located on both the piezoelectric substrates 12 and 13.

Fifth Embodiment

Figure 12:
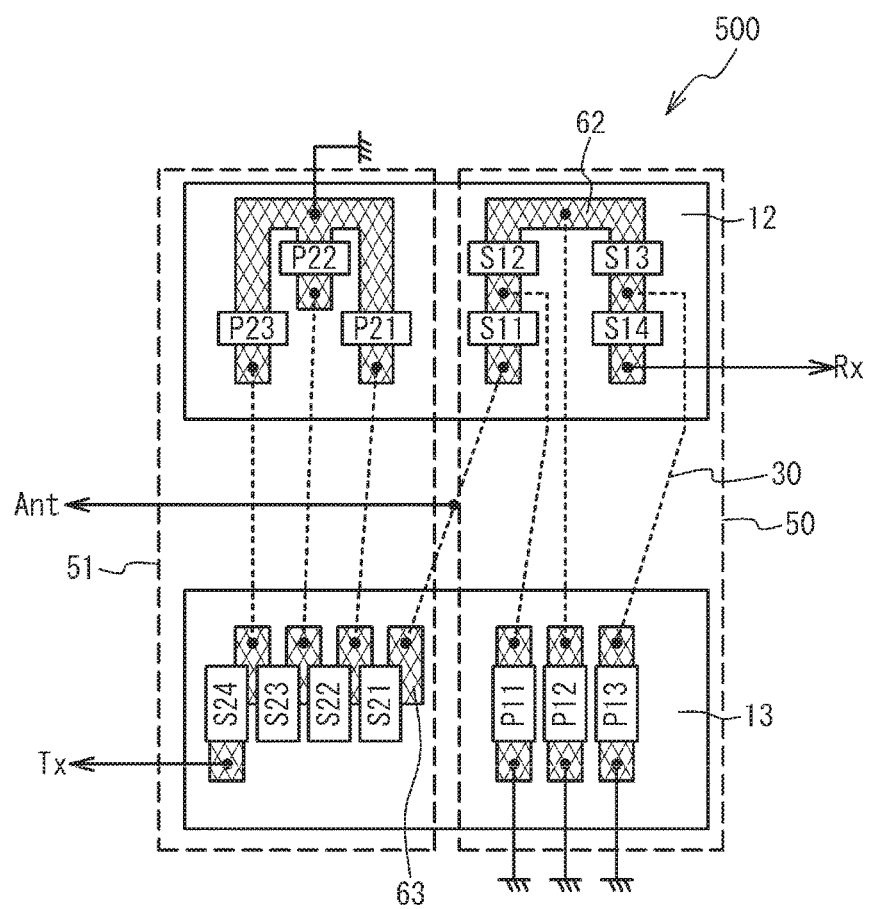
FIG. 12 is a plan view of an acoustic wave device in accordance with a fifth embodiment.

A fifth embodiment is an exemplary duplexer as in the fourth embodiment. The cross-sectional view of an acoustic wave device of the fifth embodiment is the same as that of the third embodiment illustrated in FIG. 7, and the description thereof is thus omitted. FIG. 12 is a plan view of the acoustic wave device in accordance with the fifth embodiment. FIG. 12 illustrates a plan view of the opposite surface of the piezoelectric substrate 12 from the surface bonded to the support substrate 11 and a plan view of the opposite surface of the piezoelectric substrate 13 from the surface bonded to the support substrate 11. FIG. 12 simplistically illustrates resonators.

As illustrated in FIG. 12, in an acoustic wave device 500 of the fifth embodiment, located on the piezoelectric substrate 12 are series resonators S11 through S14 constituting the receive filter 50 and parallel resonators P21 through P23 constituting the transmit filter 51. Wiring lines 62 located on the piezoelectric substrate 12 are coupled to the series resonators S11 through S14 and the parallel resonators P21 through P23. Located on the piezoelectric substrate 13 are parallel resonators P11 through P13 constituting the receive filter 50 and series resonators S21 through S24 constituting the transmit filter 51. Wiring lines 63 located on the piezoelectric substrate 13 are coupled to the parallel resonators P11 through P13 and the series resonators S21 through S24.

The series resonators S11 through S14 and the parallel resonators P11 through P13 constituting the receive filter 50 are electrically coupled through the via wirings 30. The series resonators S21 through S24 and the parallel resonators P21 through P23 constituting the transmit filter 51 are electrically coupled through the via wirings 30. The antenna terminal Ant, the transmit terminal Tx, the receive terminal Rx, and the ground terminal GND respectively correspond to the antenna pad Ant, the transmit pad Tx, the receive pad Rx, and the ground pad GND in FIG. 9C.

In the fifth embodiment, located on the piezoelectric substrate 12 are the series resonators S11 through S14 constituting the receive filter 50 and the parallel resonators P21 through P23 constituting the transmit filter 51. Located on the piezoelectric substrate 13 are the parallel resonators P11 through P13 constituting the receive filter 50 and the series resonators S21 through S24 constituting the transmit filter 51. The skirt characteristics at the low frequency side of the transmission characteristics of the receive filter 50 are mainly affected by the parallel resonators P11 through P13, while the skirt characteristics at the high frequency side are mainly affected by the series resonators S11 through S14. The skirt characteristics at the low frequency side of the transmission characteristics of the transmit filter 51 are mainly affected by the parallel resonators P21 through P23, while the skirt characteristics at the high frequency side are mainly affected by the series resonators S21 through S24. When the guard band between the transmit band and the receive band is narrow, the skirt characteristics closer to the guard band is preferably steep. The skirt characteristics are steepened by reducing the electromechanical coupling coefficient as described above. For example, when the receive band is higher in frequency than the transmit band, the parallel resonators P11 through P13 of the receive filter 50 and the series resonators S21 through S24 of the transmit filter 51 preferably have small electromechanical coupling coefficients. Since the parallel resonators P11 through P13 of the receive filter 50 and the series resonators S21 through S24 of the transmit filter 51 are located on the piezoelectric substrate 13, the electromechanical coupling coefficients of the parallel resonators P11 through P13 of the receive filter 50 and the series resonators S21 through S24 of the transmit filter 51 can be reduced by using a piezoelectric substrate made of a proper material and having a proper cut angle for the piezoelectric substrate 13.

On the other hand, the skirt characteristics at the opposite side from the guard band is not required to be steep so much compared to the skirt characteristics closer to the guard band. Instead, the skirt characteristics at the opposite side from the guard band is preferably set so as to make the passband of the filter as wide as possible. The bandwidth can be widen by increasing the electromechanical coupling coefficient as described above. For example, when the receive band is higher in frequency than the transmit band, the series resonators S11 through S14 of the receive filter 50 and the parallel resonators P21 through P23 of the transmit filter 51 preferably have large electromechanical coupling coefficients. Since the series resonators S11 through S14 of the receive filter 50 and the parallel resonators P21 through P23 of the transmit filter 51 are located on the piezoelectric substrate 12, the electromechanical coupling coefficients of the series resonators S11 through S14 of the receive filter 50 and the parallel resonators P21 through P23 of the transmit filter 51 can be made to be large by using a piezoelectric substrate made of a proper material and having a proper cut angle for the piezoelectric substrate 12.

Thus, the fifth embodiment can steepen the skirt characteristics closer to the guard band and widen the passband.

The fifth embodiment has described a duplexer including the receive filter 50 and the transmit filter 51 as an example, but the acoustic wave device may be a dual filter including two receive filters, or a dual filter including two transmit filters.

Sixth Embodiment

Figure 13:
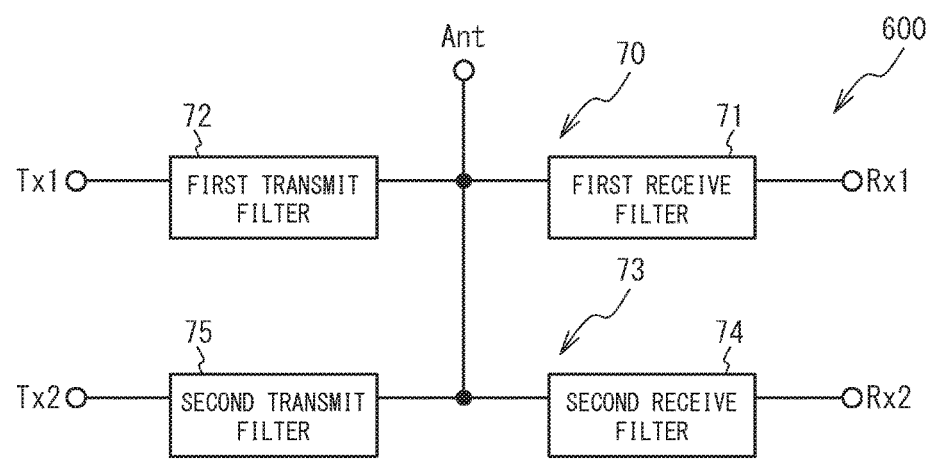
FIG. 13 illustrates an acoustic wave device in accordance with a sixth embodiment.

A sixth embodiment is an exemplary quadplexer. FIG. 13 illustrates an acoustic wave device in accordance with the sixth embodiment. As illustrated in FIG. 13, an acoustic wave device 600 of the sixth embodiment includes a first duplexer 70 and a second duplexer 73. The first duplexer 70 includes a first receive filter 71 connected between the antenna terminal Ant and a receive terminal Rx1 and a first transmit filter 72 connected between the antenna terminal Ant and a transmit terminal Tx1. The second duplexer 73 includes a second receive filter 74 connected between the antenna terminal Ant and a receive terminal Rx2 and a second transmit filter 75 connected between the antenna terminal Ant and a transmit terminal Tx2. The first receive filter 71, the first transmit filter 72, the second receive filter 74, and the second transmit filter 75 are, for example, ladder-type filters or double-mode type filters, and have different pas sbands.

Figure 14A:
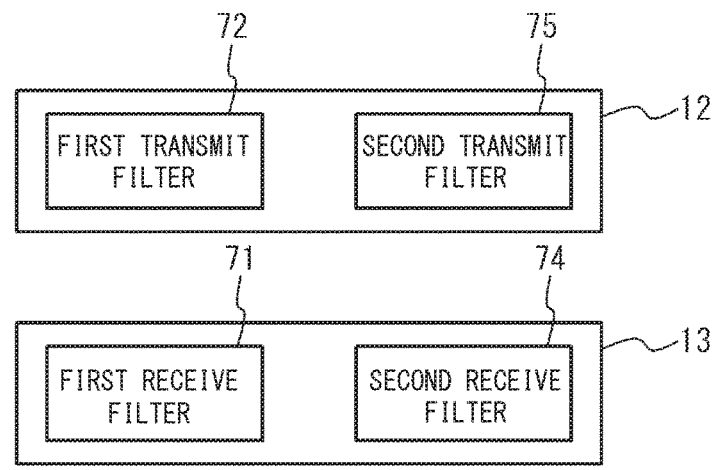
FIG. 14A is a plan view of the acoustic wave device in accordance with the sixth embodiment.
Figure 14B:
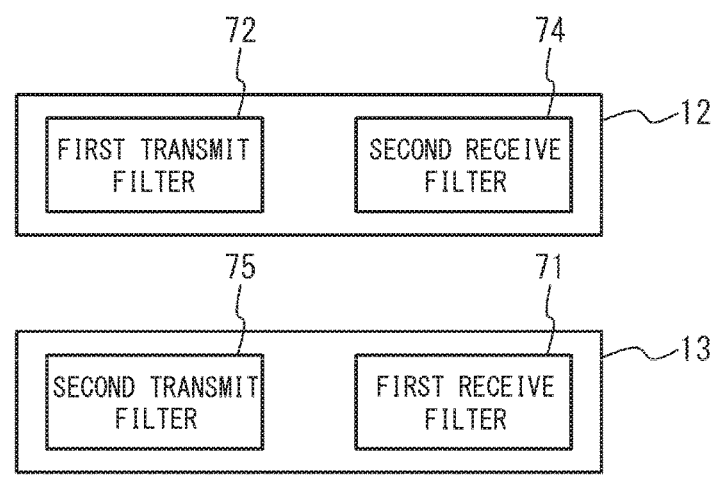
FIG. 14B is a plan view of an acoustic wave device in accordance with a first variation of the sixth embodiment.

FIG. 14A is a plan view of the acoustic wave device in accordance with the sixth embodiment, and FIG. 14B is a plan view of an acoustic wave device in accordance with a first variation of the sixth embodiment. FIG. 14A and FIG. 14B simplistically illustrate filters. As illustrated in FIG. 14A, in the acoustic wave device of the sixth embodiment, the first transmit filter 72 and the second transmit filter 75 are located on the piezoelectric substrate 12, and the first receive filter 71 and the second receive filter 74 are located on the piezoelectric substrate 13.

As described in the sixth embodiment, the acoustic wave device may be a quadplexer in which one of the transmit filter and the receive filter of each of two duplexers is located on the piezoelectric substrate 12, and the other is located in the piezoelectric substrate 13.

As illustrated in FIG. 14B, in the acoustic wave device in accordance with the first variation of the sixth embodiment, the first transmit filter 72 and the second receive filter 74 are located on the piezoelectric substrate 12, and the second transmit filter 75 and the first receive filter 71 are located on the piezoelectric substrate 13. As illustrated in FIG. 2, since the piezoelectric substrate 12, the support substrate 11, and the piezoelectric substrate 13 form the bonding substrate 10, the first receive filter 71 is arranged closer to one of the oppositely-facing end surfaces in the longitudinal direction of the bonding substrate 10, and the first transmit filter 72 is arranged closer to the other. The second receive filter 74 is arranged closer to one of the oppositely-facing end surfaces in the longitudinal direction of the bonding substrate 10, and the second transmit filter 75 is arranged closer to the other.

In the first variation of the sixth embodiment, the first receive filter 71 located on the piezoelectric substrate 13 is located closer to one of the oppositely-facing end surfaces of the bonding substrate 10, and the first transmit filter 72 located on the piezoelectric substrate 12 is located closer to the other. This structure separates the first receive filter 71 from the first transmit filter 72, improving the isolation characteristics of the first duplexer 70. In the same manner, the second receive filter 74 located on the piezoelectric substrate 12 is located closer to one of the oppositely-facing end surfaces of the bonding substrate 10, and the second transmit filter 75 located on the piezoelectric substrate 13 is located closer to the other. This structure separates the second receive filter 74 from the second transmit filter 75, improving the isolation characteristics of the second duplexer 73.

Seventh Embodiment

Figure 15:
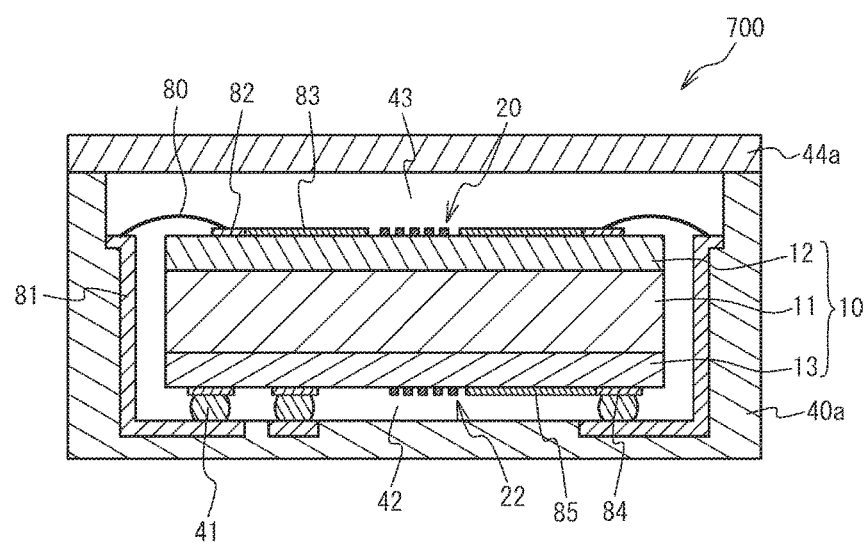
FIG. 15 is a cross-sectional view of an acoustic wave device in accordance with a seventh embodiment.

FIG. 15 is a cross-sectional view of an acoustic wave device in accordance with a seventh embodiment. As illustrated in FIG. 15, in an acoustic wave device 700 of the seventh embodiment, the bonding substrate 10, on which the acoustic wave resonators 20 and 22 are mounted, is installed in the recess portion of a recess-shaped package substrate 40a. The bonding substrate 10 is flip-chip mounted on the package substrate 40a by the bumps 41 so that the surface, on which the acoustic wave resonator 22 is located, of the piezoelectric substrate 13 faces the package substrate 40a. The acoustic wave resonator 22 is exposed to the air gap 42 between the piezoelectric substrate 13 and the package substrate 40a. A lid 44a with a planar shape covers the recess portion of the package substrate 40a and seals the bonding substrate 10. The lid 44a is preferably made of metal in consideration of hermetic sealing, but may be made of other materials such as resin. The acoustic wave resonator 20 is exposed to the air gap 43 between the piezoelectric substrate 12 and the lid 44a. The acoustic wave resonators 20 and 22 are electrically coupled through a wiring line 83, a pad 82, a wire 80, a wiring line 81, the bump 41, a pad 84, and a wiring line 85.

Eighth Embodiment

Figure 16:
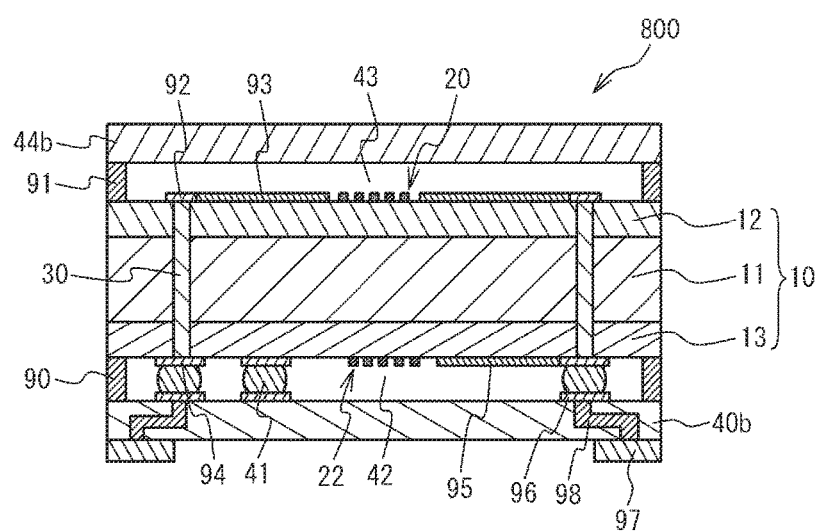
FIG. 16 is a cross-sectional view of an acoustic wave device in accordance with an eighth embodiment.

FIG. 16 is a cross-sectional view of an acoustic wave device in accordance with an eighth embodiment. As illustrated in FIG. 16, in an acoustic wave device 800 of the eighth embodiment, the bonding substrate 10 is flip-chip mounted on a package substrate 40b by the bumps 41 so that the surface of the piezoelectric substrate 13 on which the acoustic wave resonator 22 is located faces the package substrate 40b with a planar shape. The acoustic wave resonator 22 is exposed to the air gap 42 between the piezoelectric substrate 13 and the package substrate 40b. Foot pads 97 used to provide an electrical connection with an external device is located on the lower surface of the package substrate 40b. A frame body 90 surrounding the bumps 41 and the acoustic wave resonator 22 together is bonded to the piezoelectric substrate 13 and the package substrate 40b. This structure seals the acoustic wave resonator 22 with the package substrate 40b and the frame body 90. The frame body 90 is preferably made of metal in consideration of hermetic sealing, but may be made of other materials such as resin.

A frame body 91 surrounding the acoustic wave resonator 20 is located on an opposite surface of the piezoelectric substrate 12 from the support substrate 11. Located on the frame body 91 is a lid 44b having a planar shape so as to form the air gap 43 to which the acoustic wave resonator 20 is exposed. This structure seals the acoustic wave resonator 20 with the frame body 91 and the lid 44b. The frame body 91 and the lid 44b are preferably made of metal in consideration of hermetic sealing, but may be made of other materials such as resin.

The acoustic wave resonator 20 is electrically coupled to the foot pad 97 on the rear surface of the package substrate 40b through a wiring line 93, a pad 92, the via wiring 30, a pad 94, the bump 41, a pad 96, and a via wiring 98. The acoustic wave resonator 22 is electrically coupled to the foot pad 97 on the rear surface of the package substrate 40b through a wiring line 95, the pad 94, the bump 41, the pad 96, and the via wiring 98.

Ninth Embodiment

Figure 17:
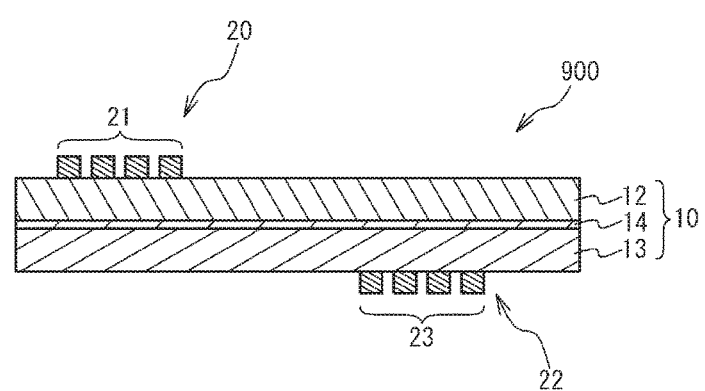
FIG. 17 is a cross-sectional view of an acoustic wave device in accordance with a ninth embodiment.

FIG. 17 is a cross-sectional view of an acoustic wave device 900 in accordance with a ninth embodiment. As illustrated in FIG. 17, in the acoustic wave device 900 of the ninth embodiment, the acoustic wave resonator 20 including the IDT 21 is located on the first principal surface of the piezoelectric substrate 12. The second principal surface of the piezoelectric substrate 12 opposite from the first principal surface of the piezoelectric substrate 12 is bonded to the first principal surface of the piezoelectric substrate 13 through a layer 14 that is an amorphous layer or an adhesive agent layer. When the piezoelectric substrate 12 is directly bonded to the piezoelectric substrate 13, the layer 14 is an amorphous layer. When the piezoelectric substrate 12 is bonded to the piezoelectric substrate 13 with an adhesive agent, the layer 14 is an adhesive agent layer. The layer 14 has a thickness of, for example, approximately 0.5 µm. The acoustic wave resonator 22 including the IDT 23 is located on the second principal surface of the piezoelectric substrate 13 opposite from the first principal surface of the piezoelectric substrate 13. The piezoelectric substrates 12 and 13 may have the same thickness, or different thicknesses.

In the ninth embodiment, the second principal surface of the piezoelectric substrate 12, of which the first principal surface includes the acoustic wave resonator 20 including the IDT formed thereon, is bonded to the first principal surface of the piezoelectric substrate 13, of which the second principal surface includes the acoustic wave resonator 22 including the IDT 23 formed thereon, by the layer 14 that is an amorphous layer or an adhesive agent layer. Also in this case, the bulk wave generated from the IDT 21 is reflected by the layer 14, and therefore is inhibited from entering the IDT 23, and the bulk wave generated from the IDT 23 is reflected by the layer 14, and therefore is inhibited from entering the IDT 21. Thus, the deterioration of the characteristics of the acoustic wave resonators 20 and 22 is reduced.

In the ninth embodiment, the material, the thickness, and the crystal-axis orientation of the piezoelectric substrates 12 and 13 may be the same between the piezoelectric substrates 12 and 13. In this case, the thermal stresses generated in the piezoelectric substrates 12 and 13 cancel out each other.

In the first through ninth embodiments, the acoustic wave resonators 20 and 22 are not limited to surface acoustic wave resonators, and may be Love wave resonators or boundary acoustic wave resonators.

Although the embodiments of the present invention have been described in detail, it is to be understood that the various change, substitutions, and alterations could be made hereto without departing from the spirit and scope of the invention.

What is claimed is:

1. An acoustic wave device comprising:
a support substrate;
a first piezoelectric substrate bonded to a first principal surface of the support substrate, the first piezoelectric substrate being a single crystal substrate,
a first acoustic wave resonator located on an opposite surface of the first piezoelectric substrate from a surface to which the support substrate is bonded, the first acoustic wave resonator including an IDT;
a second piezoelectric substrate bonded to a second principal surface of the support substrate opposite from the first principal surface, the second piezoelectric substrate being a single crystal substrate; and
a second acoustic wave resonator located on an opposite surface of the second piezoelectric substrate from a surface to which the support substrate is bonded, the second acoustic wave resonator including an IDT,
wherein the first piezoelectric substrate is a rotated Y-cut X-propagation lithium tantalate substrate or a rotated Y-cut X-propagation lithium niobate substrate,
the second piezoelectric substrate is a rotated Y-cut X-propagation lithium tantalate substrate or a rotated Y-cut X-propagation lithium niobate substrate, and
an X-axis orientation of a crystal orientation of the first piezoelectric substrate and an X-axis orientation of a crystal orientation of the second piezoelectric substrate are oriented in different directions.

2. An acoustic wave device comprising:
a first piezoelectric substrate;
a first acoustic wave resonator located on a first principal surface of the first piezoelectric substrate, the first acoustic wave resonator including an IDT;
a second piezoelectric substrate of which a first principal surface is bonded to a second principal surface of the first piezoelectric substrate opposite from the first principal surface of the first piezoelectric substrate;
a second acoustic wave resonator located on a second principal surface of the second piezoelectric substrate opposite from the first principal surface of the second piezoelectric substrate, the second acoustic wave resonator including an IDT; and
a layer bonding the second principal surface of the first piezoelectric substrate and the first principal surface of the second piezoelectric substrate, the layer being an amorphous layer or an adhesive agent layer,
wherein the first piezoelectric substrate is a rotated Y-cut X-propagation lithium tantalate substrate or a rotated Y-cut X-propagation lithium niobate substrate,
the second piezoelectric substrate is a rotated Y-cut X-propagation lithium tantalate substrate or a rotated Y-cut X-propagation lithium niobate substrate, and
an X-axis orientation of a crystal orientation of the first piezoelectric substrate and an X-axis orientation of a crystal orientation of the second piezoelectric substrate are oriented in different directions.

3. An acoustic wave device comprising:
a support substrate;
a first piezoelectric substrate bonded to a first principal surface of the support substrate, the first piezoelectric substrate being a single crystal substrate,
a first acoustic wave resonator located on an opposite surface of the first piezoelectric substrate from a surface to which the support substrate is bonded, the first acoustic wave resonator including an IDT;
a second piezoelectric substrate bonded to a second principal surface of the support substrate opposite from the first principal surface, the second piezoelectric substrate being a single crystal substrate; and
a second acoustic wave resonator located on an opposite surface of the second piezoelectric substrate from a surface to which the support substrate is bonded, the second acoustic wave resonator including an IDT,
wherein acoustic impedance of the support substrate is higher than acoustic impedance of the first piezoelectric substrate and acoustic impedance of the second piezoelectric substrate.

4. The acoustic wave device according to claim 3, wherein the first piezoelectric substrate is a rotated Y-cut X-propagation lithium tantalate substrate or a rotated Y-cut X-propagation lithium niobate substrate,
the second piezoelectric substrate is a rotated Y-cut X-propagation lithium tantalate substrate or a rotated Y-cut X-propagation lithium niobate substrate, and
an X-axis orientation of a crystal orientation of the first piezoelectric substrate and an X-axis orientation of a crystal orientation of the second piezoelectric substrate are oriented in a same direction.

5. The acoustic wave device according to claim 3, further comprising:

a plurality of series connected resonators located on the opposite surface of the first piezoelectric substrate, the series resonators being the first acoustic wave resonator and constituting a ladder-type filter; and a plurality of parallel connected resonators located on the opposite surface of the second piezoelectric substrate, the parallel resonators being the second acoustic wave resonator and constituting the ladder-type filter.

6. The acoustic wave device according to claim 5, wherein the first piezoelectric substrate and the second piezoelectric substrate are made of a same material, and have different cut angles.

7. The acoustic wave device according to claim 5, wherein the first piezoelectric substrate and the second piezoelectric substrate are made of different materials.

8. The acoustic wave device according to claim 3, further comprising:

a first filter located on the opposite surface of the first piezoelectric substrate and composed of the first acoustic wave resonator; and a second filter located on the opposite surface of the second piezoelectric substrate and composed of the second acoustic wave resonator.

9. The acoustic wave device according to claim 8, wherein the first filter is a receive filter connected between an antenna terminal and a receive terminal and constituting a duplexer, and is located closer to one of oppositely-facing end surfaces in a longitudinal direction of a bonding substrate formed by bonding the first piezoelectric substrate, the support substrate, and the second piezoelectric substrate, and the second filter is a transmit filter connected between the antenna terminal and a transmit terminal and constituting the duplexer, and is located closer to another of the oppositely-facing end surfaces in the longitudinal direction of the bonding substrate.

10. The acoustic wave device according to claim 3, further comprising:

a first set of series resonators and a first set of parallel resonators located on the opposite surface of the first piezoelectric substrate, the first set of series resonators being a part of the first acoustic wave resonator and constituting a first ladder-type filter, and the set of first parallel resonators being another part of the first acoustic wave resonator and constituting a second ladder-type filter; and a second set of parallel resonators and a second set of series resonators located on the opposite surface of the second piezoelectric substrate, the second parallel resonators being a part of the second acoustic wave resonator and constituting the first ladder-type filter, and the second series resonators being another part of the second acoustic wave resonator and constituting the second ladder-type filter.

11. The acoustic wave device according to claim 10, wherein the first ladder-type filter is a receive filter connected between an antenna terminal and a receive terminal and constituting a duplexer, and the second ladder-type filter is a transmit filter connected between the antenna terminal and a transmit terminal and constituting the duplexer.

* * * * *